United States Patent [19]
Liu

[11] Patent Number: 6,095,850
[45] Date of Patent: Aug. 1, 2000

[54] ELECTRIC ADAPTER WITH DISPLAY UNIT

[76] Inventor: Daniel Liu, 4F, No.10, Alley 59, Lane 42, Min Chuan Road, Hsin Tien, Taipei Hsien, Taiwan

[21] Appl. No.: 09/209,012

[22] Filed: Dec. 11, 1998

[51] Int. Cl.$^7$ .................................................. H01R 3/00
[52] U.S. Cl. ........................... 439/488; 439/638; 439/650
[58] Field of Search ..................... 439/488, 489, 439/490, 638, 650, 651

[56] References Cited

U.S. PATENT DOCUMENTS

| | | | |
|---|---|---|---|
| 4,331,122 | 5/1982 | Sohner et al. | 123/595 |
| 5,225,816 | 7/1993 | Lebby et al. | 340/653 |

FOREIGN PATENT DOCUMENTS 0038587  3/1979  Japan ..................................... 439/651

Primary Examiner—Khiem Nguyen
Attorney, Agent, or Firm—Dougerty & Troxell

[57] ABSTRACT

An electric adapter with a display unit capable of indicating various electrical parameters of an electric appliances is disclosed. The adapter includes a housing, a plug, an outlet socket, a control circuit and a display unit. The adapter is electrically connected between an electric socket and the electric appliance. When the electric appliance works, the control circuit detects various electrical parameters of the electric appliance and then displays the electrical parameters on the display unit. The electrical parameters includes present time, voltage value, current value, watt, kilowatt-hour, apparent power value, power factor.

13 Claims, 3 Drawing Sheets

ELECTRIC ADAPTER WITH DISPLAY UNIT

BACKGROUND OF THE INVENTION

1. Field of the Invention

The present invention relates to an adapter for an electric appliance, and more particularly to an electric adapter with display unit mounted on the adapter, capable of displaying various electrical parameters of the electric appliance.

2. Description of the Prior Art

Conventionally, a specific electronic measuring instrument is used to measure a quantity or variable of an electric appliance in order to know the electrical parameter of the electric appliance.

For example, a commercial voltmeter or volt-ohm-millimeter is generally used to measure the voltage value of an electric socket. Typically, the voltmeter is provided with a scale selecting switch. To measure the voltage level, a proper AC voltage scale must be selected by operating the scale selecting switch, and then a positive testing probe and a negative testing probe plugged into the voltmeter must be carefully inserted into the sockets respectively for performing the voltage measurement. Again for example, when it is desired to know the current passing through an electric appliance, such as a rice cooker, an ampere-meter or a hook type amperemeter is used to measure the current flow. Such measuring operation can be performed only by those skilled in electric field. For ordinary users or nonprofessional persons, such work can be hardly done.

Furthermore, it will be more difficult for ordinary users to measure the electrical parameters such as kilowatt-hour, power factor, watt, etc. of the electric appliances.

Thus, it is desirable to provide an improved electric adapter with a display unit which is capable of indicating various electrical parameters of an electric appliance.

SUMMARY OF THE INVENTION

Consequently, it is a primary object of the present invention to provide an electric adapter connected between an electric socket and an electric appliance. The electric adapter is equipped with a display unit capable of displaying relevant electrical parameters of an electric appliances.

It is a further object of the present invention to provide an electric adapter with display unit thereon. The electric adapter includes a housing, a plug, an outlet socket, a control circuit and a display unit. The adapter can be directly plugged into an electric socket. The outlet socket of the adapter is used to be plugged by a plug of the electric appliance.

It is still a further object of the present invention to provide an electric adapter with display unit. When an electric appliance plugged on the adapter works, the control circuit of the adapter of the present invention can detect the power parameter of the electric appliance. The display unit mounted on the adapter can display various electrical parameters of the electric appliance, such as voltage value, current value, watt, kilowatt-hour, apparent power value, power factor, etc. The display unit may be designed to normally indicate the present time.

The present invention can be best understood through the following description and accompanying drawings, wherein:

DETAILED DESCRIPTION OF THE PREFERRED EMBODIMENT

Figure 1:
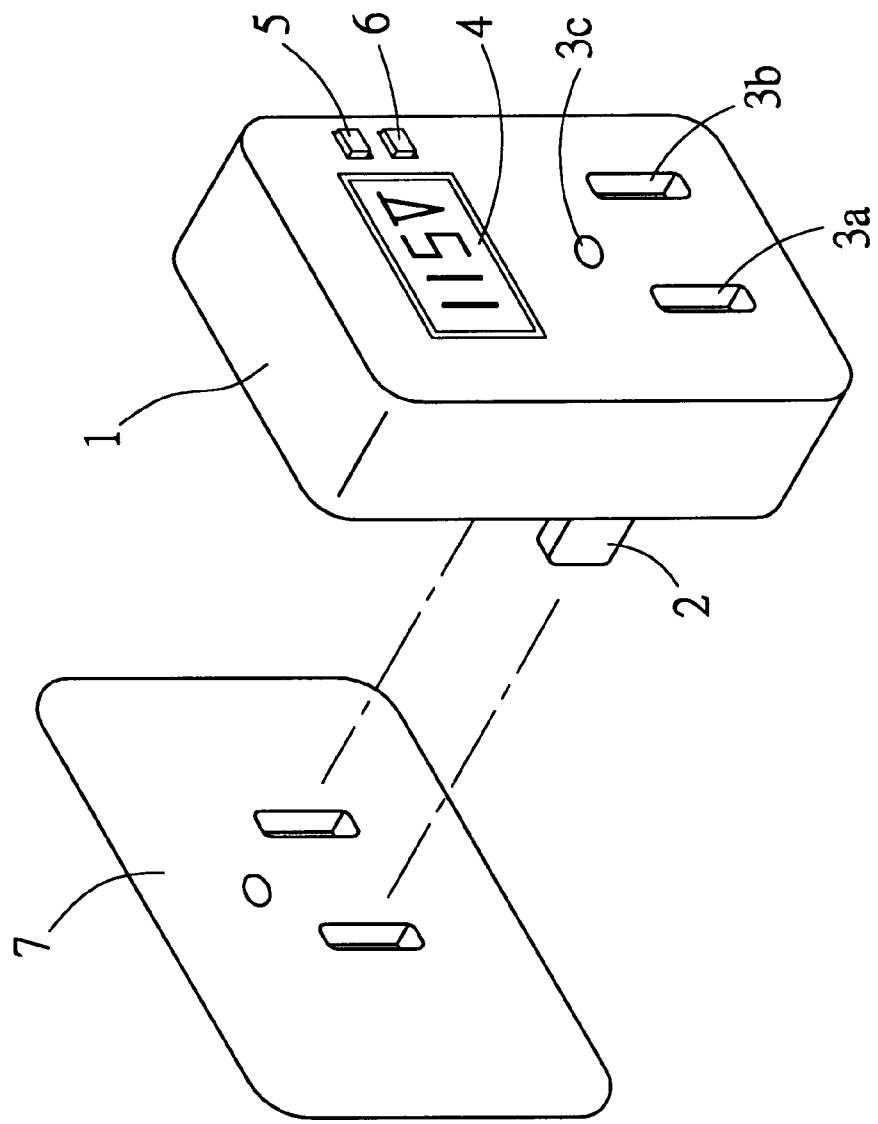
FIG. 1 is a perspective view showing that the electric adapter of the present invention indicates a voltage value on its display unit.

With reference to FIG. 1, it is a perspective view of the electric adapter 1 in accordance with a preferable embodiment of the present invention. A plug 2 is arranged on the rear side of the electric adapter 1 which can be plugged into an electric socket 7. An outlet socket including three holes 3a, 3b, and 3c is provided on the front panel of the electric adapter 1. A plug of an electric appliance can be plugged into the outlet socket for obtaining a power source via the adapter 1. The outlet socket shown in. FIG. 1 is in a form of known three-hole socket. It may be in a form of two-hole socket as necessary.

The front panel of the adapter 1 includes a display unit 4 which may be a known LED display or LCD display for showing relevant electrical parameters of the electric appliance. In addition, the front panel of the adapter 1 is equipped with a power switch 5 for turning on or off the adapter 1. The front panel is also equipped with a displaying mode selection switch 6 for selectively showing various electric data available on the display unit 4.

Figure 2:
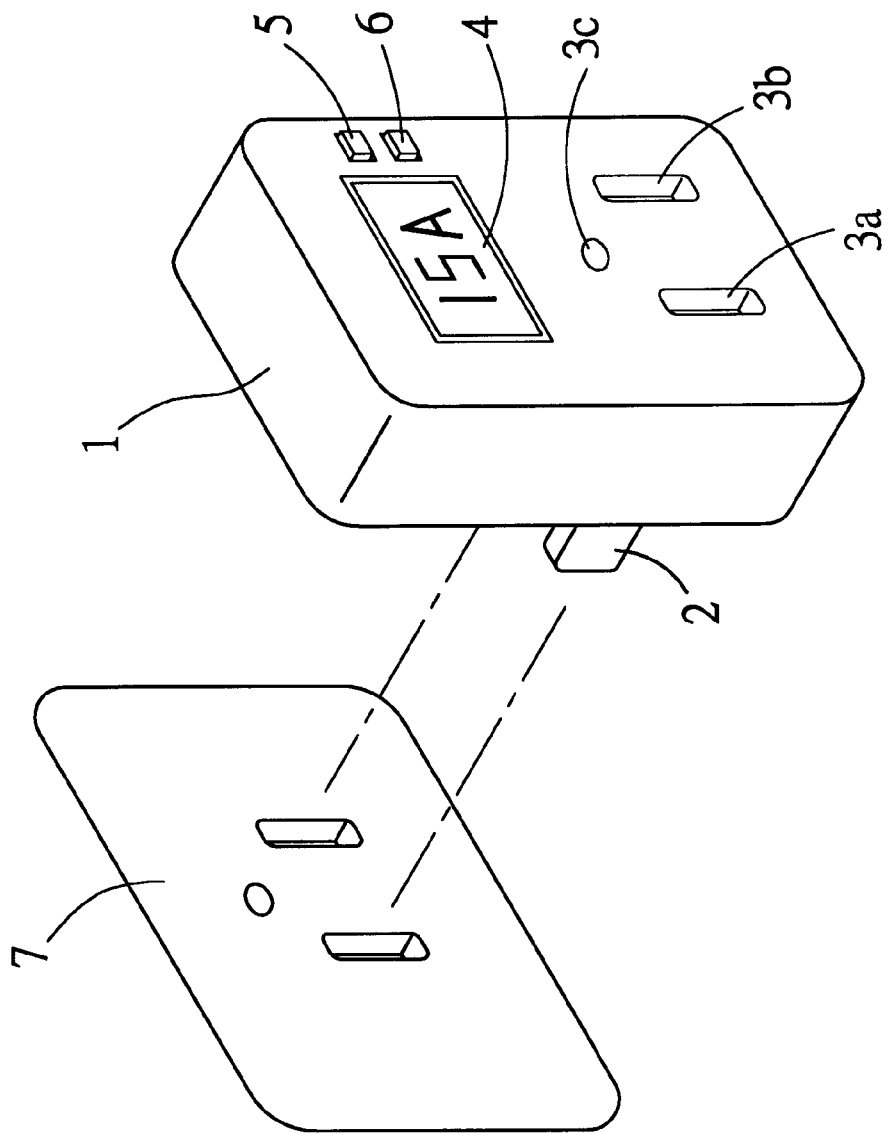
FIG. 2 is a perspective view showing that the electric adapter of the present invention indicates a current value on its display unit.

In a preferred embodiment of the present invention, the electric data of the electrical parameter of the electric appliance for example includes voltage value, current value, watt, kilowatt-hour, apparent power value, power factor, etc. In the case that no electric appliance is electrically connected to the adapter or the adapter is not activated, the display unit 4 of the adapter may be designed to normally indicate the present time. Each time the displaying mode selection switch 6 is depressed, the display unit 4 will indicate the voltage level, current value, watt, kilowatt-hour, apparent power value, and power factor in sequence. FIG. 1 shows that a voltage value is indicated on the display unit, while FIG. 2 shows that a current value is indicated on the display unit.

Figure 3:
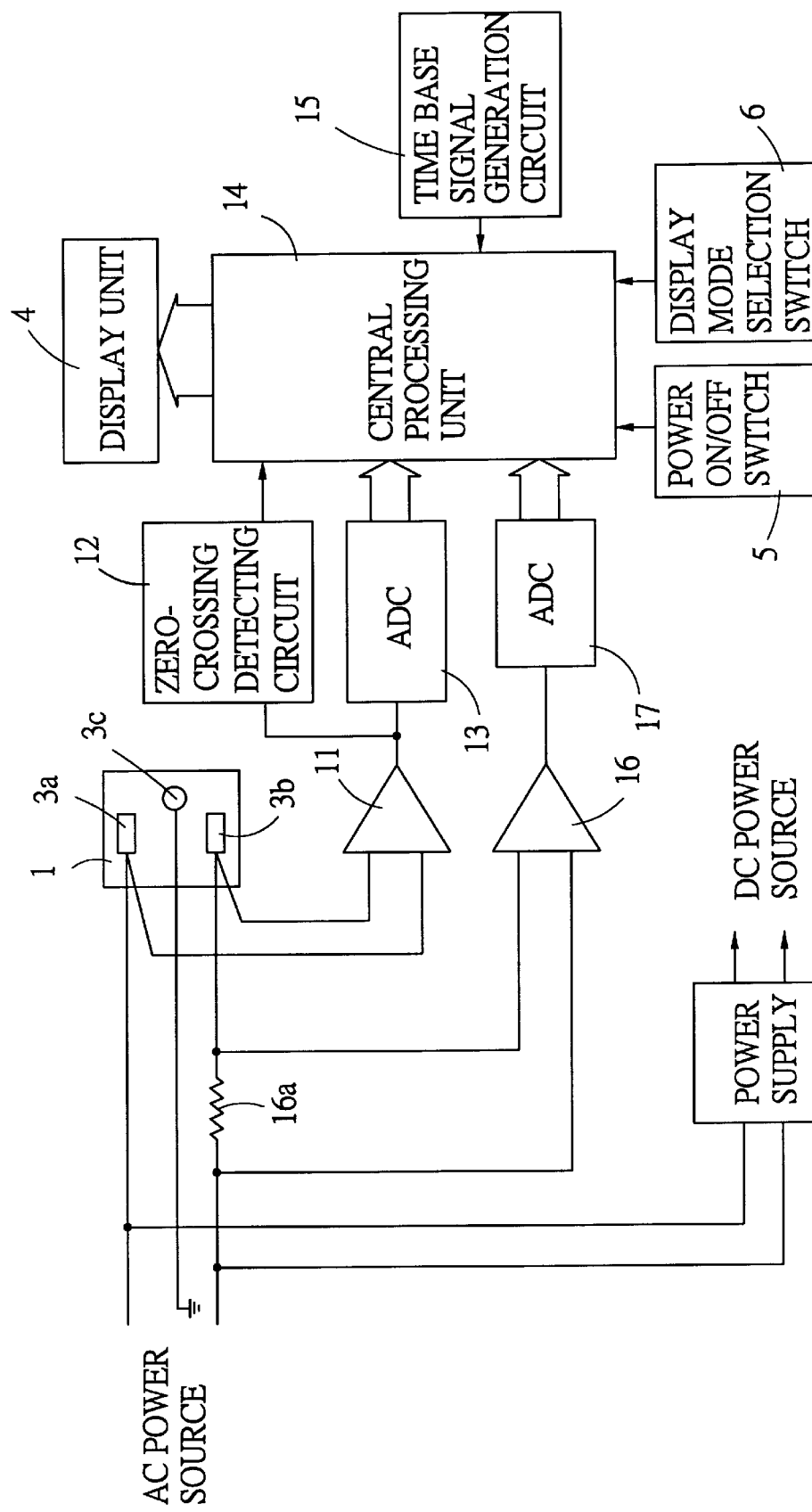
FIG. 3 is a circuit block diagram of the control circuit of the present invention.

FIG. 3 is a circuit block diagram of the control circuit of the present invention. The control circuit is arranged on a circuit board inside the housing of the adapter for detecting the power parameter of the electric appliance.

In a preferred embodiment of the present invention, the control circuit includes a voltage amplifier 11. The two input ends of the voltage amplifier 11 are connected across the socket holes 3a, 3b of the adapter 1 for detecting the voltage value supplied to the electric appliance (not shown).

A voltage zero-crossing detecting circuit 12 is capable of detecting the zero-crossing point of the power source. Each time the value of the alternating current voltage is zero, the zero-crossing detecting circuit 12 will generate an output pulse signal at its output end to a central processing unit 14.

An analog-to-digital converter 13 is used for converting the analog voltage generated by the voltage amplifier 11 into digital signal which is also sent to the central processing unit 14.

The central processing unit 14 is capable of receiving the signals generated by the zero-crossing detecting circuit 12 and the analog-to-digital converter 13, and then calculating and processing the signals and controlling the display unit. The control signals sent from the power on/off switch 5 and displaying mode selection switch 6 are directly sent to the central processing unit 14 for turning on/off the power and selecting the displaying mode of the display unit.

A time base signal generator 15 is used to generate a time base signal which is sent to the central processing unit 15 as a basis clock signal for time calculation and display.

A current amplifier 16 is capable of detecting the value of the current passing through the electric appliance. The current value may be obtained in such a manner that a resistor 16a is serially connected with one of the power wires, and two input ends of the current amplifier 16 are electrically connected across the resistor 16a in parallel.

An analog-to-digital converter 17 is arranged to convert the analog current value generated by the current amplifier 16 into digital signal which is sent to the central processing unit 14.

A power supply 18 obtains a power source from the power wires and then converting the power source into DC voltage which is output to serve as a working voltage for the control circuit of the present invention.

A display unit 4 arranged on the housing of the adapter for indicating the electrical parameter of the electric appliance.

The voltage amplifier 11, the zero-crossing detecting circuit 12 and the analog-to-digital converter 13 form a voltage detecting circuit of the present invention. The current amplifier 16 and the analog-to-digital converter 17 form a current detecting circuit of the present invention.

According to the above arrangement, when the electric appliance works, the adapter can detect, calculate and process the electrical parameter of the electric appliance. The electrical parameters indicated on the display unit may include voltage value, current value, watt number, kilowatt-hour, apparent power value, power factor, etc. A part of these data are directly displayed by the display unit under control of the central processing unit (such as voltage value and current value), while the other of the data are obtained by calculation of the central processing unit according to conventional formulas on the basis of the basic data (such as watt, kilowatt-hour, apparent power value, power factor, etc.).

It should be noted that the above description and accompanying drawings are only used to illustrate one embodiment of the present invention, not intended to limit the scope thereof. Any modification of the embodiment should fall within the scope of the present invention.

What is claimed is:

1. An electric adapter configured to be connected between an electric socket and an electric appliance, for indicating a plurality of electrical parameters of the electric appliance, said electric adapter comprising:

a housing;

a plug arranged on a rear of the housing for insertion into an electric socket;

an outlet socket formed on the housing, whereby the electric appliance can be electrically connected to the outlet socket;

a control circuit including a central processing unit located within the housing for detecting a plurality of electrical parameters of the electric appliance during operation a display unit arranged on the housing for displaying at least one of the plurality of electrical parameters detected by the control circuit; and, a mode selection switch arranged on the housing and connected to the central processing unit, the mode selection switch being operable from externally of the housing to select which of the plurality of electrical parameters is displayed by the display unit.

2. The electric adapter as claimed in claim 1, wherein the plurality of electrical parameters indicated on the display unit comprises present time, voltage value, current value, watt, kilowatt-hour, apparent power value, and power factor.

3. The electric adapter as claimed in claim 1, further comprising a power on/off switch arranged on the housing and connected to the central processing unit for turning on/off the adapter.

4. The electric adapter as claimed in claim 1, wherein the control circuit comprises:

a voltage detecting circuit for detecting a voltage supplied to the electric appliance and generating a voltage value;

a current detecting circuit for detecting a current supplied to the electric appliance and generating a current value; and a time base signal generator for providing a time base signal; whereby the central processing unit receives the voltage value generated by the voltage detecting circuit, the current value generated by the current detecting circuit, and time base signal to calculate the plurality of electrical parameters.

5. The electric adapter as claimed in claim 4, wherein the voltage detecting circuit comprises:

a voltage amplifier electrically connected to the output outlet of the adapter in parallel connection for generating an analog-voltage signal;

a voltage zero-crossing detecting circuit for detecting a zero-crossing signal of the analog voltage signal and then sending the zero-crossing signal to the central processing unit; and an analog-to-digital converter for converting the analog voltage signal generated by the voltage amplifier into a digital voltage value, and then sending the digital voltage value to the central processing unit.

6. The electric adapter as claimed in claim 4, wherein the current detecting circuit comprises:

a current amplifier for detecting a current flow supplied to the electric appliance, and then generating an analog current signal; and an analog-to-digital converter for converting the analog current signal generated by the current amplifier into a digital current value, and then sending the digital current value to the central processing unit.

7. An electric adapter connected between an electric socket and an electric appliance, for indicating a plurality of electrical parameters of the electric appliance, said electric adapter comprising:

a housing;

a plug arranged on a rear of the housing for insertion into an electric socket;

an outlet socket formed on the housing, whereby the electric appliance can be electrically connected to the outlet socket;

a control circuit arranged in the housing for detecting the plurality of electrical parameters of the electric appliance during operation; and a display unit arranged on the housing for displaying at least one of the plurality of electrical parameters received and processed by the control circuit, wherein the control circuit comprises:

a voltage detecting circuit for detecting a voltage supplied to the electric appliance and generating a voltage value;

a current detecting circuit for detecting a current supplied to the electric appliance and generating a current value;

a time base signal generator for providing a time base signal; and a central processing unit receiving the voltage value generated by the voltage detecting circuit, the current value generated by the current detecting circuit, and the time base signal for calculating the plurality of electrical parameters, wherein the voltage detecting circuit comprises:

a voltage amplifier electrically connected to the output outlet of the adapter in parallel connection for generating an analog voltage signal;

a voltage zero-crossing detecting circuit for detecting a zero-crossing signal of the analog voltage signal and then sending the zero-crossing signal to the central processing unit; and an analog-to-digital converter for converting the analog voltage signal generated by the voltage amplifier into a digital voltage value, and then sending the digital voltage value to the central processing unit.

8. The electric adapter as claimed in claim 7, wherein the plurality of electrical parameters indicated on the display unit comprises present time, voltage value, current value, watt, kilowatt-hour, apparent power value, and power factor.

9. The electric adapter as claimed in claim 7, further comprising a power on/off switch arranged on the housing for turning on/off the adapter and a displaying mode selection switch arranged on the housing.

10. The electric adapter as claimed in claim 7, wherein the current detecting circuit comprises:

a current amplifier for detecting a current flow supplied to the electric appliance, and then generating an analog current signal; and an analog-to-digital converter for converting the analog current signal generated by the current amplifier into a digital current value, and then sending the digital current value to the central processing unit.

11. An electric adapter connected between an electric socket and an electric appliance, for indicating a plurality of electrical parameters of the electric appliance, said electric adapter comprising:

a housing;

a plug arranged on a rear of the housing for insertion into an electric socket;

an outlet socket formed on the housing, whereby the electric appliance can be electrically connected to the outlet socket;

a control circuit arranged in the housing for detecting the plurality of electrical parameters of the electric appliance during operation; and a display unit arranged on the housing for displaying at least one of the plurality of electrical parameters received and processed by the control circuit, wherein the control circuit comprises:

a voltage detecting circuit for detecting a voltage supplied to the electric appliance and generating a voltage value;

a current detecting circuit for detecting a current supplied to the electric appliance and generating a current value;

a time base signal generator for providing a time base signal; and, a central processing unit receiving the voltage value generated by the voltage detecting circuit, the current value generated by the current detecting circuit, and the time base signal for calculating the plurality of electrical parameters, wherein the current detecting circuit comprises:

a current amplifier for detecting a current flow supplied to the electric appliance, and then generating an analog current signal; and an analog-to-digital converter for converting the analog current signal generated by the current amplifier into a digital current value, and then sending the digital current value to the central processing unit.

12. The electric adapter as claimed in claim 11, wherein the plurality of electrical parameters indicated on the display unit comprises present time, voltage value, current value, watt, kilowatt-hour, apparent power value, and power factor.

13. The electric adapter as claimed in claim 11, further comprising a power on/off switch arranged on the housing for turning on/off the adapter and a displaying mode selection switch arranged on the housing.

* * * * *

(12) EX PARTE REEXAMINATION CERTIFICATE (7542nd)
United States Patent
Liu

(10) Number: US 6,095,850 C1
(45) Certificate Issued: Jun. 1, 2010

(54) ELECTRICAL ADAPTER WITH DISPLAY UNIT

(76) Inventor: Daniel Liu, 4F, No. 10, Alley 59, Lane 42, Min Chuan Road, Hsin Tien, Taipei Hsien (TW)

Reexamination Request:
No. 90/010,392, Feb. 5, 2009

Reexamination Certificate for:
Patent No.: 6,095,850
Issued: Aug. 1, 2000
Appl. No.: 09/209,012
Filed: Dec. 11, 1998

(51) Int. Cl.
*H01R 3/00* (2006.01)

(52) U.S. Cl. .................. 439/488; 439/638; 439/650
(58) Field of Classification Search .................. None
See application file for complete search history.

(56) References Cited

U.S. PATENT DOCUMENTS

| | | | |
|---|---|---|---|
| 4,931,725 A | 6/1990 | Hutt et al. | |
| 5,589,764 A | 12/1996 | Lee | |
| 5,869,960 A | 2/1999 | Brand | |

FOREIGN PATENT DOCUMENTS

| AU | WO 8605887 | 10/1986 |
|---|---|---|
| DE | 44 26 509 | 2/1996 |
| GB | 2 041 588 | 9/1980 |
| JP | 4-315964 | 11/1992 |
| JP | 8-184616 | 7/1996 |

OTHER PUBLICATIONS

Hong Kong Electronics, vol. 5, 1996, Hong Kong Development Council 1996.
Hong Kong Electronics, Aug. 1997, Hong Kong Development Council 1997.
Hong Kong Electronics, Oct. 1997, Hong Kong Development Council 1997.
Hong Kong Electronics, Dec. 1997, Hong Kong Development Council 1997.

*Primary Examiner*—My-Trang Ton

(57) ABSTRACT

An electric adapter with a display unit capable of indicating various electrical parameters of an electric appliances is disclosed. The adapter includes a housing, a plug, an outlet socket, a control circuit and a display unit. The adapter is electrically connected between an electric socket and the electric appliance. When the electric appliance works, the control circuit detects various electrical parameters of the electric appliance and then displays the electrical parameters on the display unit. The electrical parameters includes present time, voltage value, current value, watt, kilowatt-hour, apparent power value, power factor.

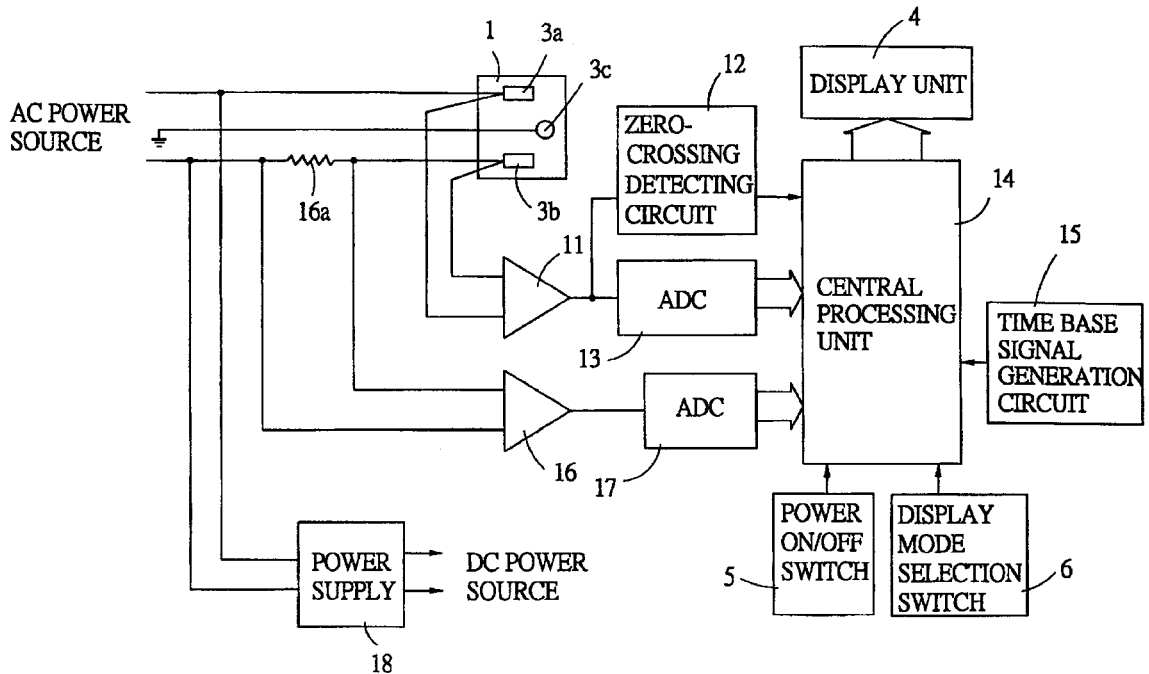

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 7-10 is confirmed.

Claims 1, 4, 5 and 11 are determined to be patentable as amended.

Claims 2-3, 6 and 12-13, dependent on an amended claim, are determined to be patentable.

1. An electric adapter configured to be connected between an electric socket and an electric appliance, for indicating a plurality of electrical parameters of the electric appliance, said electric adapter comprising:
   a housing;
   a plug arranged on a rear of the housing for insertion into an electric socket;
   an outlet socket formed on the housing, whereby the electric appliance can be electrically connected to the outlet socket;
   a control circuit including a central processing unit located within the housing for detecting a plurality of electrical parameters of the electric appliance during operation
   a display unit arranged on the housing for displaying at least one of the plurality of electrical parameters detected by the control circuit;
   *a voltage detecting circuit for detecting a voltage supplied to the electric appliance and generating a voltage value;*
   *a voltage amplifier electrically connected to the output outlet of the adapter in parallel connection for generating an analog-voltage signal;*
   *a voltage zero-crossing detecting circuit for detecting a zero-crossing signal of the analog voltage signal and then sending the zero-crossing signal to the central processing unit;*
   *a time base signal generator for providing a time base signal to the central processing unit; and,*
   a mode selection switch arranged on the housing and connected to the central processing unit, the mode selection switch being operable from externally of the housing to select which of the plurality of electrical parameters is displayed by the display unit.

4. The electric adapter as claimed in claim 1, wherein the control circuit comprises:
   [a voltage detecting circuit for detecting a voltage supplied to the electric appliance and generating a voltage value;]
   a current detecting circuit for detecting a current supplied to the electric appliance and generating a current value; [and
   a time base signal generator for providing a time base signal;] whereby the central processing unit receives the voltage value generated by the voltage detecting circuit, the current value generated by the current detecting circuit, and time base signal to calculate the plurality of electrical parameters.

5. The electric adapter as claimed in claim 4, wherein the voltage detecting circuit comprises:
   [a voltage amplifier electrically connected to the output outlet of the adapter in parallel connection for generating an analog-voltage signal;
   a voltage zero-crossing detecting circuit for detecting a zero-crossing signal of the analog voltage signal and then sending the zero-crossing signal to the central processing unit; and]
   an analog-to-digital converter for converting the analog voltage signal generated by the voltage amplifier into a digital voltage value, and then sending the voltage value to the central processing unit.

11. An electric adapter connected between an electric socket and an electric appliance, for indicating a plurality of electrical parameters of the electric appliance, said electric adapter comprising:
    a housing;
    a plug arranged on a rear of the housing for insertion into an electric socket;
    an outlet socket formed on the housing, whereby the electric appliance can be electrically connected to the outlet socket;
    a control circuit arranged in the housing for detecting the plurality of electrical parameters of the electric appliance during operation; and
    a display unit arranged on the housing for displaying at least one of the plurality of electrical parameters received and processed by the control circuit, wherein the control circuit comprises:
      a voltage detecting circuit for detecting a voltage supplied to the electric appliance and generating a voltage value;
      *a voltage zero-crossing detecting circuit for detecting a zero-crossing signal of an analog voltage signal and then sending the zero-crossing signal to the central processing unit;*
      a current detecting circuit for detecting a current supplied to the electric appliance and generating a current value;
      a time base signal generator for providing a time base signal; and
      a central processing unit receiving the voltage value generated by the voltage detecting circuit, the current value generated by the current detecting circuit, and the time base signal for calculating the plurality of electrical parameters, wherein the current detecting circuit comprises:
        a current amplifier for detecting a current flow supplied to the electric appliance, and then generating an analog current signal; and
        an analog-to-digital converter for converting the analog current generated signal by the current amplifier into a digital current value, and then sending the digital current value to the central processing unit.

* * * * *